United States Patent
Kim et al.

(10) Patent No.: US 11,810,850 B2
(45) Date of Patent: Nov. 7, 2023

(54) SIGNAL ROUTING IN INTEGRATED CIRCUIT PACKAGING

(71) Applicant: Google LLC, Mountain View, CA (US)

(72) Inventors: Jin Young Kim, Mountain View, CA (US); Zhonghua Wu, Fremont, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/684,218

(22) Filed: Mar. 1, 2022

(65) Prior Publication Data

US 2022/0254711 A1 Aug. 11, 2022

Related U.S. Application Data

(63) Continuation of application No. 16/910,244, filed on Jun. 24, 2020, now Pat. No. 11,302,624, which is a
(Continued)

(51) Int. Cl.
*H01L 23/20* (2006.01)
*H01L 23/50* (2006.01)
(Continued)

(52) U.S. Cl.
CPC ........ *H01L 23/50* (2013.01); *H01L 23/49816* (2013.01); *H01L 23/49822* (2013.01); *H01L 23/49838* (2013.01); *H01L 23/528* (2013.01)

(58) Field of Classification Search
CPC .............. H01L 23/50; H01L 23/49816; H01L 23/49822; H01L 23/49838; H01L 23/528; H01L 23/5383; H01L 23/5386; H01L 2224/16225; H01L 2224/11; H01L 2224/13061; H01L 2224/0401;
(Continued)

(56) References Cited

U.S. PATENT DOCUMENTS 4,551,747 A 11/1985 Gilbert
4,866,507 A 9/1989 Jacobs et al.
(Continued)

FOREIGN PATENT DOCUMENTS

CN 1662820 8/2005

OTHER PUBLICATIONS

Communication pursuant to Article 94(3) EPC in European Appln. No. 18793094.6, dated Mar. 5, 2020, 6 pages.
(Continued)

*Primary Examiner* — Nikolay K Yushin
(74) *Attorney, Agent, or Firm* — Fish & Richardson P.C.

(57) ABSTRACT

In some implementations, a substrate for coupling to an integrated circuit includes multiple layers. Each of the multiple layers has, in a particular region of the substrate, a repeating pattern of regions corresponding to power and ground. The multiple layers include (i) a top layer having, in the particular region, power contacts and ground contacts for coupling to an integrated circuit and (ii) a bottom layer having, in the particular region, power contacts and ground contacts for coupling to another device. At least one layer of the multiple layers has a repeating pattern of signal traces that extend along and are located between the regions corresponding to ground in the at least one layer.

15 Claims, 4 Drawing Sheets

Related U.S. Application Data continuation of application No. 16/474,687, filed as application No. PCT/US2018/053848 on Oct. 2, 2018, now Pat. No. 10,734,319.

(60) Provisional application No. 62/569,063, filed on Oct. 6, 2017.

(51) Int. Cl.
   *H01L 23/498* (2006.01)
   *H01L 23/528* (2006.01)

(58) Field of Classification Search
   CPC . H01L 2224/49171; H01L 2924/15192; H01L 2924/15311; H01L 2924/3011; H01L 2924/0002; H01L 2924/10253
   See application file for complete search history.

(56) References Cited

U.S. PATENT DOCUMENTS

| | | |
|---|---|---|
| 5,272,600 A | 12/1993 | Carey |
| 5,623,160 A | 4/1997 | Liberkowski et al. |
| 5,986,893 A | 11/1999 | Leigh et al. |
| 6,594,811 B2 | 7/2003 | Katz |
| 6,714,903 B1 | 3/2004 | Chu et al. |
| 6,769,102 B2 | 7/2004 | Frank et al. |
| 6,917,525 B2 | 7/2005 | Mok |
| 6,995,322 B2 | 2/2006 | Chan et al. |
| 7,078,812 B2 * | 7/2006 | Frank .................... H05K 1/115 |
| | | 257/E23.079 |
| 7,375,417 B2 | 5/2008 | Tran |
| 7,562,271 B2 | 7/2009 | Shaeffer et al. |
| 7,564,359 B2 | 7/2009 | Koh et al. |
| 8,198,724 B1 | 6/2012 | Wu et al. |
| 8,766,925 B2 | 7/2014 | Perlin et al. |
| 9,147,447 B2 | 9/2015 | Dally et al. |
| 9,172,145 B2 * | 10/2015 | Puzella ................ H05K 1/0206 |
| 2003/0051910 A1 | 3/2003 | Dyke et al. |
| 2003/0099097 A1 | 5/2003 | Mok |
| 2003/0201472 A1 | 10/2003 | Ho |
| 2005/0039950 A1 | 2/2005 | Chan et al. |
| 2006/0043537 A1 * | 3/2006 | Frank .................... H01L 23/5386 |
| | | 257/E23.079 |
| 2006/0118929 A1 | 6/2006 | Ramakrishnan et al. |
| 2007/0257802 A1 | 11/2007 | Koh et al. |
| 2009/0108369 A1 | 4/2009 | Chu |
| 2014/0268976 A1 | 9/2014 | Dally et al. |
| 2015/0015453 A1 * | 1/2015 | Puzella ................ H05K 1/0206 |
| | | 333/1.1 |
| 2019/0223299 A1 | 7/2019 | Ye et al. |

OTHER PUBLICATIONS

International Search Report and Written Opinion in International Appln. No. PCT/US2018/053848, dated Jan. 21, 2019, 13 pages.
International Preliminary Report on Patentability in International Application No. PCT/US2018/053848, dated Apr. 8, 2020, 8 pages.
Office Action in Chinese Appln. No. 201880004566.8, dated Dec. 5, 2022, 10 pages (with English translation).
Notice of Allowance in Chinese Appln. No. 201880004566.8, dated Apr. 20, 2023, 4 pages (with English translation).

* cited by examiner

SIGNAL ROUTING IN INTEGRATED CIRCUIT PACKAGING

CROSS-REFERENCE TO RELATED APPLICATIONS

This patent application is a continuation application (and claims the benefit of priority under 35 USC 120) of U.S. patent application Ser. No. 16/910,244, filed Jun. 24, 2020, which is a continuation of U.S. patent application Ser. No. 16/474,687, filed June 28, 2019, U.S. Pat. No. 10,734,319, which is a National Stage application under 35 U.S.C. § 371 of International Application No. PCT/US2018/053848, having an International Filing Date of Oct. 2, 2018, which claims priority to U.S. Application No. 62/569,063, filed Oct. 6, 2017. The disclosure each of the prior applications is incorporated by reference herein.

BACKGROUND

In some devices, one or more integrated circuits are attached to a substrate, e.g., a circuit board, a circuit card, a chip carrier, etc. Packaging electronic products may involve electrically connecting multiple semiconductor die using the substrate.

SUMMARY

In some implementations, a substrate for coupling to integrated circuits includes multiple layers that each include a repeating pattern of regions corresponding to power and ground. These regions can be arranged in alternating stripes across a particular region of the substrate. One or more of the layers includes signal traces that provide connections between different semiconductor die that are attached to the substrate. The signal traces can be arranged among the repeating patterns to provide high signal quality even among high-density connections for power and ground. For example, signal traces for ground-referenced signals, such as DDR DRAM signals, can be placed in stripes corresponding to ground, with conductors connected to ground being placed along the signal traces. These and other techniques discussed below can allow a substrate to provide signal routing and high-density power and ground connections in a region, while using a small number of layers, e.g., 4 layers or fewer.

In general, integrated circuits (ICs) on different semiconductor die can be interconnected using a multilayer packaging substrate. In some implementations, a semiconductor die may be attached to a multilayer packaging substrate using a ball grid array (BGA). The grids of metallic bumps or balls on the outer layers of a multilayer packaging substrate may be arranged into alternating regions of ground connections and power connections. The electrical connections at inner layers of the substrate, including vias, may also be arranged into alternating regions of ground connections and power connections. The alternating ground and power regions may be aligned. For example, the ground regions of each of the layers may be placed directly over each other. Similarly, power conducting regions can also be placed directly over each other. This arrangement of ground and power connections provides a stacked configuration, in at least a region of the substrate, where regions of ground connections are stacked across layers and regions of power connections are stacked across layers.

In some implementations, data signal traces may be routed underneath a particular region of a semiconductor die by interspersing the signal traces at regular positions among the repeating pattern of power and ground regions. For example, a layer that includes a grid of contacts or vias may have certain regions depopulated, with signal traces in the depopulated regions. One or multiple data signal traces may be patterned along the depopulated regions of the layer to connect contacts of one semiconductor die to contacts of a second semiconductor die.

To maintain a consistent reference for data signals, the depopulated region of a layer where signal traces are placed may be wholly contained within a ground region. As a result, signal traces for ground-reference signals can be bordered on both sides within the layer by only ground connections. The density and complexity of data signal routing can be increased by including signal traces multiple layers of the multilayer packaging substrate. To preserve signal integrity, data signal traces may not be included on adjacent layers of the multilayer packaging substrate. Instead, one or more intermediate layers may be placed between layers that include data signal routing. For example, the substrate may alternate between layers that include signal traces in a particular region and layers that do not include signal traces in the particular region. The intermediate layers without data signal traces can have their power and ground regions aligned with the adjacent layers to maintain high signal quality.

For many mobile devices, such as mobile phones, the overall thickness of the device is constrained. To provide a semiconductor package with an appropriate thickness, the substrate may be constrained to a limited number of layers, e.g., 6 layers, 4 layers, etc. While a larger number of layers could provide more flexibility in routing, it may provide an unacceptable thickness of the package. Even with the limitation in the number of layers, signal traces for data transfer can be routed across the area where a high density of power and ground vias are located, using the repeating patterns of power and ground regions and the connections discussed below.

In one general aspect, a substrate for coupling to an integrated circuit includes: multiple layers that each have, in a particular region of the substrate, a repeating pattern of regions corresponding to power and ground, the multiple layers including (i) a top layer having, in the particular region, power contacts and ground contacts for coupling to an integrated circuit and (ii) a bottom layer having, in the particular region, power contacts and ground contacts for coupling to another device. At least one layer of the multiple layers has a repeating pattern of signal traces that extend along and are located between the regions corresponding to ground in the at least one layer.

Implementations may include one or more of the following features. For example, the substrate is a flip-chip ball grid array (FCBGA) substrate, and the power contacts and ground contacts on the bottom layer are ball grid array (BGA) solder balls.

In some implementations, the repeating patterns of regions corresponding to power and ground are arranged with the regions for power in each of the multiple layers located directly over each other.

In some implementations, the top layer includes signal traces, arranged in a repeating pattern, that extend along and are located between the ground contacts for coupling to the integrated circuit.

In some implementations, the signal traces are arranged in multiple groups of signal traces that each include multiple signal traces. Each group of signal traces has an extent from one side of the particular region to an opposite side of the particular region, and each group of signal traces is closer to the ground contacts of the top layer than the power contacts of the top layer along the entire extent of the signal traces across the particular region.

In some implementations, the multiple layers include an intermediate layer directly below the top layer. The intermediate layer includes metal ground regions coupled to the ground contacts of the top layer. The metal ground regions are located directly beneath and extend along the signal traces.

In some implementations, the multiple layers include an intermediate layer between the top layer and the bottom layer. The intermediate layer includes alternating metal regions that are respectively coupled to groups of the ground contacts of the top layer and power contacts of the top layer.

In some implementations, the repeating patterns of regions corresponding to power and ground are alternating power stripes and ground stripes, and signal traces are located in the ground stripes. The power stripes are aligned in each of the multiple layers, and the ground stripes are aligned in each of the multiple layers.

In some implementations, the top layer includes a grid of contacts that includes a repeating pattern of rows of the power contacts and ground contacts. The grid includes multiple depopulated rows that do not include contacts, and the signal traces extend along the depopulated rows.

In some implementations, the signal traces are each placed over and are aligned to extend along ground contacts of the bottom layer.

In some implementations, two or more layers of the multiple layers include signal traces across the particular region.

In some implementations, the signal traces of the two or more layers are arranged so that signal traces of one of the layers are arranged over the signal traces of the other of the layers, and the multiple layers include an intermediate layer having ground regions located between the signal traces of the two or more layers.

In some implementations, the substrate includes no more than four layers.

In some implementations, the multiple layers comprise a first layer, a second layer directly below the first layer, a third layer directly below the second layer, and a fourth layer directly below the third layer. The top layer is the first layer, and the bottom layer is the fourth layer. The first layer and the third layer each include signal traces extending across the particular region. The second layer and fourth layer do not include signal traces extending across the particular region.

In some implementations, the repeating patterns of regions corresponding to power and ground in the particular region extend substantially linearly across the particular region, and the signal traces extend substantially linearly across the particular region.

In some implementations, the integrated circuit is a semiconductor die, and the substrate is configured to receive the semiconductor die over the particular region of the substrate. The substrate does not include any input contacts or output contacts in the particular region.

In some implementations, the particular region of the substrate is located within an integrated circuit region of the substrate that is configured to mate with the integrated circuit The substrate has, on the top layer, (i) a first memory region configured to mate with one or more memory devices, the first memory region being located at a first side of the particular region, and (ii) a second memory region configured to mate with one or more memory devices, the second memory region being located at a second side of the particular region. The integrated circuit includes (i) first contacts for coupling with the one or more memory devices of the first memory region, and (ii) second contacts for coupling with the one or more memory device of the second memory region, the first contacts and the second contacts being located at the first side of the particular region. The signal traces provide a path across the particular region for the electrical signals to be transmitted between the second contacts located at the first side of the particular region and the one or more memory devices at the second memory region that is located at the second side of the particular region.

In some implementations, the second side of the integrated circuit region is located opposite the first side of the integrated circuit region.

In some implementations, the substrate includes one or more printed circuit board layers.

In some implementations, the substrate includes one or more redistribution layers.

In another general aspect, a system includes: an integrated circuit; a first memory device; a second memory device; and a substrate comprising multiple layers. The integrated circuit, the first memory device, and the second memory device are attached to a top surface of the substrate. The substrate has a particular region located under the integrated circuit, and the multiple layers have a repeating pattern of regions corresponding to power and ground in the particular region. The multiple layers of the substrate include (i) a top layer having, in the particular region, power contacts and ground contacts for coupling to the integrated circuit and (ii) a bottom layer having, in the particular region, power contacts and ground contacts for coupling to another device. At least one layer of the multiple layers has a repeating pattern of signal traces that extend across the particular region, and the signal traces extend along and are located between the regions corresponding to ground in the at least one layer.

Implementations may include one or more of the following features. For example, the integrated circuit has memory contacts for coupling with the first memory device and the second memory device, the memory contacts being located at a first side of the particular region of the substrate. The first memory device is attached to the top surface of the substrate at the first side of the particular region of the substrate. The second memory device is attached to the top surface of the substrate at a second side of the particular region of the substrate, the second side being different from the first side. The signal traces are configured to carry signals across the particular region between the memory contacts and the second memory device.

In some implementations, the second side of the particular region is opposite the first side.

In some implementations, the first memory device and the second memory device are ground-referenced memory devices.

In some implementations, the first memory device and the second memory device are double data rate (DDR) synchronous dynamic random access memory (SDRAM) devices.

In some implementations, the substrate is a flip-chip ball grid array (FCBGA) substrate.

In some implementations, the particular region of the substrate provides connections to power and ground to the integrated circuit, but the particular region does not provide input and output connections to the integrated circuit.

In some implementations, the particular region of the substrate is a region located under one or more processing cores of the integrated circuit. The processing cores may be, for example, processing cores of a microprocessor, an application processor, a central processing unit, a graphics processing unit, an intelligence processing unit, a digital signal processor, a neural network processing unit, a system-on-a-chip, or other integrated circuit.

Implementations may provide one or more of the following advantages. For example, data signals can be routed across areas having a high density of power and ground vias. High quality signals can be provided using the signal traces, even through areas of dense connections to power and ground. Depopulating specific areas of the ball or via arrays in the multilayer packaging substrate enables data signal traces to be routed underneath a region of a semiconductor die. This can allow arrangements of chips on a substrate that would not be available otherwise.

In some implementations, the data signal traces can be routed underneath the ball grid array of a semiconductor die while still providing power and ground connections to the semiconductor die using adjacent remaining ball and via contacts. Aligning ground regions and power regions in stacks across the layers of the multilayer packaging substrate improves signal integrity and enables data signal routing to be implemented on multiple layers of the multilayer packaging substrate. By implementing data signal routing on multiple layers of the packaging substrate, denser and more complex data signal routing schemes can be realized. The ratio of data signal traces to power/ground connections can differ in different regions of the semiconductor die to account for differing power demands of different regions of the IC. For example, for a region of the IC with high power demands, small or no regions of the grid array may be depopulated, leaving the power/ground connections to the semiconductor die largely in place to provide power to the IC, but preventing signal routing. For a region of the IC with lower power demands, larger regions of the grid array may be depopulated, allowing the placement of a greater number or length of data signal traces underneath these regions.

The techniques of the present application can address various problems often encountered in the design of electronic devices. For example, many systems typically avoid routing memory data lines and other data carriers under an integrated circuit, because doing so may restrict power delivery to important areas of the integrated circuity, may require an increased density of vias resulting in increased package impedance and inductive delay, and/or may result in data signal noise being coupled with power supply lines. These factors often cause memory signal traces and other data signals to avoid routing across the underside of an integrated circuit, especially under areas of processing cores. This can constrain the placement of memory devices and other elements, and may lead to a need for larger circuit boards to accommodate routing around an integrated circuit rather than under it. As discussed below, the features of the substrates discussed in this application can allow for the routing of data signals under integrated circuits while keeping noise low and maintaining high densities of power and ground connections under the integrated circuit. This addresses various problems in the field by allowing routing of memory signals and other data signals with high signal quality under an integrated circuit, even under areas with high power demand, such as processing cores of microprocessors and other processing units. The substrate can be kept thin by implementing data signal routing and power and ground routing using a relatively small number of substrate layers having electrically conductive paths.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Many electronic devices, such as mobile phones and computers, include multiple integrated circuits (ICs). Integrated circuits formed on different semiconductor die can be interconnected using a substrate. For example, a mobile phone may include an application specific IC (ASIC), such as an application processing unit (APU). The ASIC may be connected to one or multiple dynamic random access memory (DRAM) die. The ASIC and the DRAM die can be attached to a single substrate, which may then be attached to a circuit board or another device.

Interconnection of different semiconductor die can involve providing electrical connections for dozens or hundreds of data, power, and ground signals. Some signals may be routed between different die, and others may be routed from a die to a main circuit board (e.g., a motherboard). A substrate can provide signal traces that connect portions of different semiconductor die that are attached to the substrate. As used herein, a signal trace refers to any wiring or conductive path that is provided on a layer, and is not limited to paths created through etching or any specific manufacturing technique. The substrate can also connect portions of a die to contacts arranged to mate with a circuit board. For example, the substrate can re-arrange tightly packed contacts of a semiconductor die, e.g., by redistributing the contacts in a way that increases the size and spacing of the contacts.

In a substrate, signal traces are preferably arranged to provide high quality signals. Shorter signal traces are generally preferred to improve performance at high frequencies. Mixed signal referencing should typically be avoided. Mixed signal referencing often refers to placement of a data signal trace adjacent to both a ground and a power trace, which can result in undesired electromagnetic coupling and noise.

Figure 1:
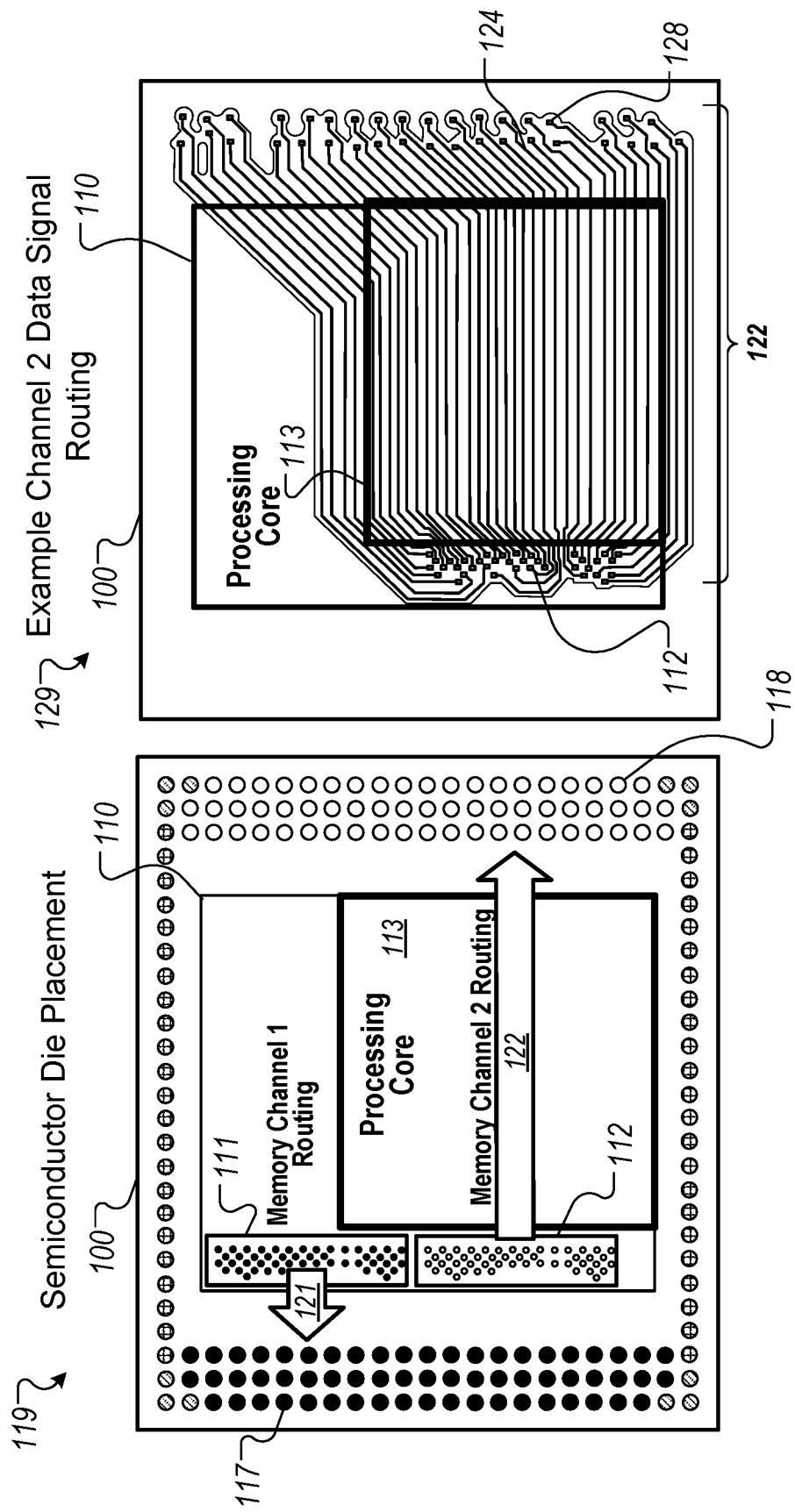
FIG. 1 is a diagram that illustrates an example of a substrate for coupling to an integrated circuit.

FIG. 1 is a diagram that illustrates an example of a packaging substrate 100. Two views 119 and 129 are provided, each showing different aspects of the substrate 100. The view 119 shows a top view showing the location of an IC and contacts where additional ICs can be coupled. The view 129 provides a cut-away view showing a lower layer of the substrate 100 that has signal traces routed under the IC to provide communication with another IC.

The substrate 100 can be used to carry an IC with one or more memory devices on both sides of the IC. In the example, the contacts for two DRAM memory channels are located on the same side of the IC, e.g., the left side. One memory channel can be connected to memory devices at the left side, near the memory contacts on the IC, with short traces extending outward from the IC. However, connecting the memory contacts for second memory channel to memory devices at the right side of the IC is not as simple. Routing the signals around the entire footprint of the IC may involve long traces that reduce signal integrity. The connection could be made by placing signal traces underneath the IC, as shown in the view 129, but this may present other challenges. For example, signal traces may pass underneath a processing core area of the IC, where many connections to ground are required. For a flip-chip packaged IC, power, ground, and data connections are made directly underneath the IC rather than at the periphery of the IC. Many power and ground connections are typically required for processing cores and other circuitry. Routing signal traces across these power and ground connections may reduce signal quality or allow only a low density of data signal traces.

In the top view 119, an IC 110 is shown attached to the packaging substrate 100. The packaging substrate 100 provides electrical connections that provide power and ground signals to the IC 110, as well as electrical connections and signal traces that interconnect the IC 110 to one or more other devices (not shown) attached to the packaging substrate 100. The surface of the packaging substrate 100 includes metallic contacts 117 and 118 that are outside of the footprint of the IC 110. The metallic contacts 117 and 118 may be, for instance solder bumps, metallic balls, conductive pads, or another means for making electrical contact.

The IC 110 may be, for example, a central processing unit (CPU), a graphics processing unit (GPU), an APU, an ASIC, or another IC. The IC 110 is flip-chip packaged, so a series of electrical contacts (e.g., solder balls) are placed along the surface of the IC 110 that faces toward the substrate 110. The IC 110 contains two sets of contacts, 111 and 112, that connect to the input/output (I/O) data lines of two memory channels of the IC 110. The contacts 111 connect to the I/O data lines of memory channel 1, and the contacts 112 connect to the I/O data lines of memory channel 2.

In FIG. 1, the two different memory channels connect to two separate memory devices (not shown) that are also attached on the packaging substrate 100. To electrically interconnect the two memory channels, electrical connections are made between the contacts 111 and 112 of the IC 110 and the contacts 117 and 118 of the packaging substrate 100. In example 100, routing memory channel 1 involves connecting the IC contacts 111 to the packaging substrate contacts 117, illustrated as routing 121. Routing memory channel 2 involves connecting IC contacts 112 to the packaging substrate contacts 118, illustrated as routing 122.

A region of the IC 110 is shown as a processing core region 113. For example, the processing core region 113 may require power and ground signals to be connected directly to the area of processing core 113, e.g., directly underneath the processing core 113 or substantially vertically through the substrate 100. Typically, making the connections for memory channel 2 through signal traces on only one or two layers would involve many data signal traces underneath the processing core region 113 of the IC 110.

The cutaway view 129 of the substrate 100 shows an example of signal routing for memory channel 2 data traces. Here, the outline of IC 110 is shown over the packaging substrate 100. The contacts 112 for memory channel 2 (located to the left of the processing core 113) are connected to the metallic contacts 128 (located on the right side of the processing core 113) through data signal traces 124 that run across the underside of the IC 110. The routing places signal traces 124 underneath the processing core 113 of the IC 110.

In example 100, the large density of signal traces 124 underneath of the processing core 113 may make it difficult to provide adequate power and ground connections to the region of processing core 113, which may prevent the IC 110 from operating properly. Further, a high density of vias in the region of signal traces would often increase package impedance and inductive delay and reduce response times. As a result, this arrangement of signal traces may limit the performance of the IC 110, due to limitations in power delivery and signal quality. As discussed below, these limitations can be decreased or avoided entirely using repeating patterns of regions for power and ground, interspersed with signal traces.

Figure 2:
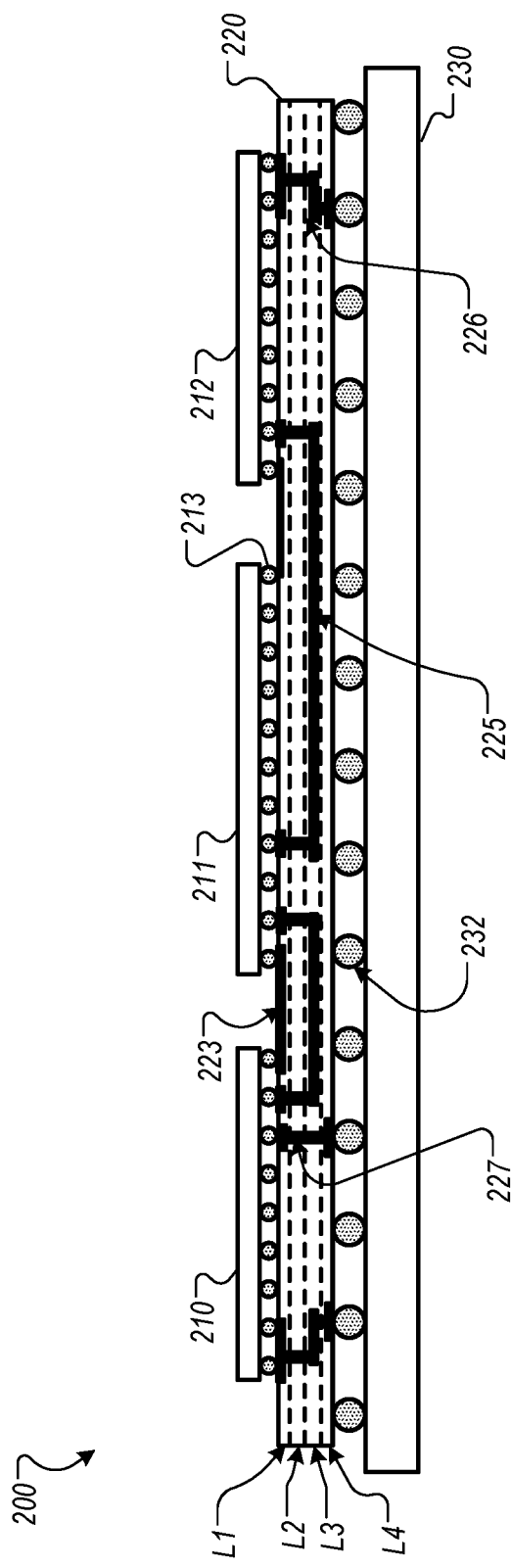
FIG. 2 is a cross-sectional view of an example of a substrate coupled with integrated circuits.

FIG. 2 is a cross-sectional view of an example of a device 200 having a substrate 220 coupled with integrated circuits. The integrated circuits are shown as multiple semiconductor die 210, 211, and 212 which are each attached to the same side of the substrate 220, e.g., a top side of the substrate 220. The die 210, 211, and 212 can be attached through, for example, flip-chip bonding. The substrate 220, in turn, is connected to a main circuit board 230. The substrate 220 provides for electrical interconnection and routing of data signals from one semiconductor die to another and between semiconductor die and the main circuit board 230. The substrate 220 also provides power and ground connections between the semiconductor die and the main circuit board 230. The substrate 220 also redistributes the connections of the ball grid array (BGA) contacts on the die 211 (or of any of the die 210, 211, 212 if appropriate) to contacts at a larger pitch for connection to the main circuit board 230

The substrate 220 enables routing of data signal lines underneath an attached semiconductor die. In FIG. 2, the multilayer packaging substrate 220 includes multiple electrically isolated layers where each layer includes conductors for data connections, power connections, and/or ground connections. The multilayer packaging substrate 220 may, for example, be a printed circuit board (PCB), a chip scale package (CSP), a flip-chip ball grid array (FCBGA), an organic substrate, a ceramic substrate, or other packaging substrate. The multilayer packaging substrate 220 may have multiple layers. Like many substrates, the substrate 220 may have ten or more layers in some instances. Nevertheless, to limit the overall thickness of the package, the substrate 220 may be limited to fewer layers, e.g., 6 layers, 4 layers, or fewer. The multilayer packaging substrate 220 may comprise a redistribution layer (RDL) for routing signal connections from the I/O terminals of the semiconductor die 211 to electrical connections on the multilayer packaging substrate 220 or on the main circuit board 230.

In FIG. 2, the multilayer packaging substrate 220 includes four stacked, electrically-isolated layers: layer L1, layer L2, layer L3, and layer L4. Layers L1 and L4 are outer layers and layers L2 and L3 are inner layers. The outer layer L1 is coupled to and communicates electrically with the semiconductor die 210, 211, 212, for example, through a ball grid array (BGA). The ball grid array is a regular array of metallic bumps (balls) 213 that make electrical connections between terminals on the semiconductor die 211 and electrical contacts (e.g., pads) on the layer L1 of the multilayer substrate. The pitch of the metallic bumps 213 within the BGA may differ for different integration technologies or different semiconductor die. For example, the pitch of the metallic bumps 213 within the BGA may be 140 microns. The pitch of the metallic bumps 213 that mate with the IC may be any value above the manufacturable limit.

The outer layer L4 of the multilayer packaging substrate 220 is coupled with the main circuit board 230, for example, through an array of solder bumps 232 that may comprise a BGA. The main circuit board 230 may be, for example, a motherboard. The solder bumps 232 connect metallic traces in the outer layer L4 of the multilayer packaging substrate 220 with electrical contacts (e.g., pads) on the main circuit board 230. The solder bumps 232 may be arranged in a regular array of the same geometry as the BGA of metallic bumps 213 on the top side of the multilayer packaging substrate 220. To mate with the main circuit board 230, the bottom-side solder bumps 232 may be arranged in a regular array with a pitch larger than the pitch of the metallic bumps 213 that mate with the IC. The pitch of the bottom-side solder bumps 232 may be a fixed integer ratio of the pitch of the top-side IC metallic bumps 213 in the BGA. For example, if the pitch of the top-side IC metallic bumps 213 in the BGA is 140 microns, the pitch of the bottom-side solder bumps 232 may be 350 microns (a 2:5 ratio). The pitch of solder bumps 232 in the bottom-side BGA may be chosen based on manufacturability and as a fixed ratio of the top-side metallic bumps 213, as determined by the required signal count and signal/power integrity needs.

Layers L1, L2, L3, and L4 may make electrical contact with adjacent layers through conductive vias that span the thickness of the layer. The conductive vias may be arranged in a grid array with a pitch that matches that of the metallic bumps 213 of the BGA on the top layer L1. The vias may be aligned with the vias in an adjacent layer such that vias are stacked directly above one another in adjacent layers. The vias may also be aligned with the metallic bumps 213 of the outer layer. The vias may be filled with a conductive metal to ensure good electrical conduction along the length of the via. Some regions of a layer may include metal regions, e.g., providing continuous conductor that can serve as a ground plane or power plane in a layer.

The layers of the multilayer packaging substrate 220 may also contain signal traces, e.g., conductive metallized paths, within a given layer to enable signal routing. In example 200, signal traces 223 and 225 are shown within layers L1 and L3, respectively. Signal traces and conductive vias through layers can electrically connect a contact on one semiconductor die to a contact on a different semiconductor die. Signal traces and conductive vias can also electrically connect a contact on a semiconductor die to an electrical contact on the main circuit board 230. For example, signal trace 223 in layer L1 electrically interconnects a contact of semiconductor die 211 to a contact of semiconductor die 210. Signal trace 225 in layer L3 electrically interconnects a contact of semiconductor die 211 to a contact of semiconductor die 212.

In some cases, metallic signal traces may be routed underneath of a semiconductor die, through a region that includes densely populated vias for power and ground. As illustrated, a substantial portion of trace 225 is routed underneath of semiconductor die 211. In some implementations, signals may be routed underneath a portion of a semiconductor die by depopulating regions of the ball or via grid array in selected layers of the multilayer packaging substrate. This technique is shown in greater detail in FIG. 3.

Figure 3:
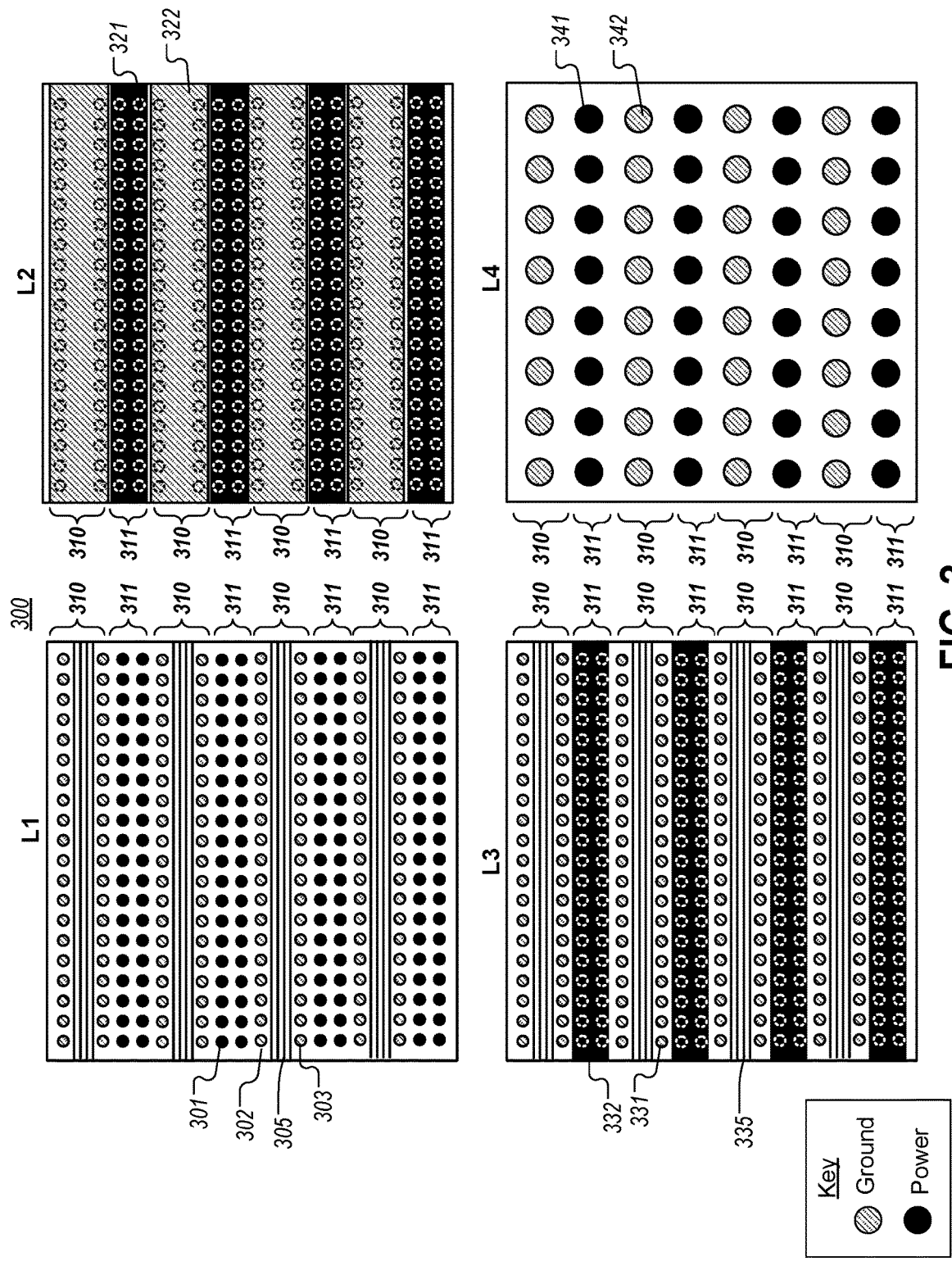
FIG. 3 is a series of top views of different layers of an example of a substrate for coupling with integrated circuits.

FIG. 3 illustrates a series of top views of different layers of an example of a substrate 300 for coupling with integrated circuits. The layers L1, L2, L3, and L4 illustrated show only a particular region of substrate 300, for example, a region located directly beneath a processing core of an integrated circuit. Accordingly, the illustrated views do not represent the entire layer or even the entire footprint of an integrated circuit chip over the substrate. In particular, the particular region of the substrate shown does not include any input or output connections between the integrated circuit, which would be located at additional portions of the substrate outside the particular region illustrated. The particular region also does not show the areas where additional chips would be attached.

In FIG. 3, data signals are routed within layers L1 and L3 in regions where portions of the ball grid array or via grid array have been depopulated. Signal traces are patterned within those depopulated regions, providing routing for data signals underneath of the semiconductor die.

Regions corresponding to power and ground are arranged in a repeating pattern. For example, each layer may include stripes corresponding to power and ground. For example, the regions can include ground stripes 310 and power stripes 311. Each stripe may span an area that includes one or more rows of the ball grid array/via grid array. The ground stripes 310 are aligned with each other, so that the ground stripes 310 are located directly over each other in the assembled substrate 300. Similarly, the power stripes 311 are also aligned so they are located directly over each other. Signal traces for ground-referenced signals can be located within the ground stripes 310, for example, in a depopulated row of the grid. If signals were referenced to power levels, then the arrangement could be reversed so that signal traces were placed in power stripes 311. The signal traces may occur in a repeating pattern along with the stripes 310, 311.

Circular features such as 301, 321, 331, 341, etc. show positions of the grid array. In layer L1, the circular features 301, 302, 303 are contacts, such as conductive bumps, to mate with solder balls of a BGA package. Vias then connect these contacts to layer L2. The circular features shown in dashed lines in layers L2 and L3 represent the locations where vias connect to the layer from the layer above. For example, the dashed circles of layer L2 show where vias connect the contacts of layer L1 to metal regions of layer L2. In layer L4, the features 341, 342 show contacts, e.g., solder bumps, arranged in a grid for coupling with a circuit board.

The grid array for layers L1 to L3 may comprise any of various geometries. For example, the bumps or vias may be aligned in a rectangular array or in a hexagonal array. In the baseline grid array of layer L1, the bumps are aligned in a square array, where each bump is separated from its four nearest neighbors by the same distance (e.g., the pitch). Layers L1, L2, and L3 contain matching grid arrays (e.g., they have the same pitch and are aligned with each grid element above one in the layer below), while the array of layer L4 may have a larger pitch.

The shading of the circular features indicates the signal level to which that feature is electrically connected. Solid-filled features represented bumps or vias that are electrically connected to the power signal level, while hash-filled features represent bumps or vias that are electrically connected to the ground signal level.

Layer L1 is the topmost layer of multilayer packaging substrate and may be in contact with a semiconductor die, for example, through a BGA. Layer L2 is the layer directly beneath L1, layer L3 is the layer directly beneath L2, and layer L4 is the layer directly beneath L3. In the four-layer multilayer packaging substrate, layer L4 is the bottom layer and is in contact with the main circuit board as shown in FIG. 2.

In order to route signal lines through the grid array of a given layer, bumps or vias may be depopulated in specified regions. In the layer L1, the grid array has been depopulated at regular intervals such that every fifth row of bumps and vias has been removed. One or more signal traces may be routed in the depopulated regions. In the example of FIG. 3, four signal traces 305 have been patterned in each depopulated row. More than four signal traces may be patterned if processing and performance tolerances allow. These signal lines may be routed to connect the I/O contacts of one semiconductor die to the I/O contacts of a different semiconductor die. In some implementations, more than one row of bumps or vias may be depopulated to accommodate data signal lines. Depopulated regions also may repeat at different intervals. For example, in some implementations, every ninth row may be depopulated or every twentieth row may be depopulated. Furthermore, the depopulated regions need not be regular arrays of rows. A depopulated region may be any shape or geometry necessary to accommodate routed signals. The regions may be depopulated at regular intervals or at irregular intervals.

By depopulating only a portion of the grid to accommodate signal traces, the remaining bumps and vias can be used to provide power and ground signals to the portion of the semiconductor directly above the grid array. In this way, data signals can be routed underneath a portion of the semiconductor die (through the depopulated regions) while still supplying power and ground signals to that portion of the semiconductor die (through the remaining bumps and vias).

In some implementations, to improve data signal integrity, the remaining bumps and vias may be connected to ground or power signal levels in an alternating stripe pattern. For example, in the layer L1, rows of bumps immediately adjacent to depopulated regions (e.g. horizontal rows of bumps 302 and 303) are electrically connected to ground, while rows of bumps not immediately adjacent to depopulated regions (e.g. horizontal row of bumps 301) are connected to the power level. In some cases, the ground-connected and power-connected stripes may have the same widths. Alternatively, the ground-connected and power-connected stripes may have different widths. For example, each ground-connected stripe may cover a region corresponding to three rows of bumps while each power-connected stripe may cover a region corresponding to two rows of bumps.

To avoid mixed signal referencing and associated signal distortion, the bumps or vias immediately adjacent to a signal traces within a layer should be connected to only one signal level (e.g. either ground-connected or power-connected). In the example of FIG. 3, the bumps immediately adjacent to the signal traces 305 in layer L1 are connected to ground, which is well-suited for ground-referenced data signals. Alternatively, for a circuit that uses power-referenced data signals, the bumps immediately adjacent to the signal traces 305 may be power-connected.

The layer L2 lies immediately below the layer L1 in the multilayer packaging substrate and includes a regular array of vias. In the example of FIG. 3, the layer L2 does not contain any data signal traces. Instead, the layer L2 is patterned with alternating ground-connected and power-connected regions. The ground and power regions in the layer L2 are patterned such that they align with the ground and power regions in the adjacent layer L1. Here, an aligned region is a region that is directly above or below a region that covers the same physical area, where that region is of the same type of electrical connection (e.g. ground-connected or power-connected). In this way, the ground regions and power regions in adjacent layers are "stacked," such that they mate with a region of the same type of electrical connection above and below. Because there is no depopulated row in the layer L2, the row immediately below signal traces in layer L1 is ground-connected. As a result, the signal traces in layer L1 are shielded on three sides by ground-connections.

In some implementations, the electrical connections may be made through metallization in the vias only. In other implementations, the electrical connection to the region may be made by patterning metal onto the area of the layer surrounding the vias, as well as into the vias. In the example of FIG. 3, electrical connections to the ground and power regions are made both by metallizing the vias and patterning metal onto the area surrounding the vias (e.g. region 322).

The layer L3 lies immediately below the layer L2 in the multilayer packaging substrate and includes a regular array of vias. In the example of FIG. 3 data signal traces have been routed across the layer by depopulating in specified regions. In particular, like layer L1, every fifth row of vias has been depopulated and replaced with one or more signal traces. Here, each depopulated row has been replaced with four signal traces (e.g. traces 335). Because the data signals are ground-referenced, the signal lines are patterned within a ground region such that vias immediately adjacent to the signal lines are ground-connected. Similar to layer L1, the remaining vias may be connected to ground or power signal levels in an alternating stripe pattern. In this example, the ground and power regions of layer L3 are patterned such that they align with the ground and power regions, respectively, of the adjacent layer L2. Similarly to layer L2, the electrical connections may be made through the vias only, or the electrical connection may be supplemented by patterning metal onto the area of the layer surrounding the vias. In the example layer L3, the electrical connections in the ground regions are shown to be made through vias only, while the electrical connections in the power regions are shown to be made by vias and metallized areas (e.g., region 332). In some implementations, however, each row of ground vias 331 may be connected together through a metal region in the layer L3.

The layer L4 lies immediately below the layer L3 in the multilayer packaging substrate 300 and includes a grid array of contacts, e.g., solder bumps, exposed at the bottom of the layer. The layer L4 is the bottom layer of the multilayer packaging substrate and electrically contacts the main circuit board through the contacts. The contacts include power contacts 341 and ground contacts 342.

The pitch of the contacts 341, 342 on layer L4 may be larger than pitch of the bump/via arrays in the L1, L2, and L3 layers. In some implementations, the pitch of grid array on the outer layer L4 may be a fixed ratio of the pitch of grid arrays in layer L1 through L3. For example, if the pitch of the grid array in layers L1 through L3 is 140 microns, the pitch of the grid array of layer L4 may be 350 microns. As a result, the pitch at layer L4 is fixed ratio of 2:5 relative to the pitch of the grid arrays for layers L1 through L3.

In the example of FIG. 3, layer L4 does not contain any data signal traces. Instead, the layer L4 is patterned with alternating ground-connected and power-connected regions. The ground and power regions in the layer L4 are patterned such that they align with the ground and power regions, respectively, of the adjacent layer L3. To enable alignment between layer L4 and layer L3, the pitch of the L3 grid array (which is the same as the pitch of the L1 and L2 arrays), the pitch of the L4 grid array, and the spacing of the alternating ground/power regions must be selected such that alignment of the ground and power regions on the layers is possible. By configuring each layer so that the ground-connected and power-connected regions align with the ground and power regions, respectively, of the adjacent layers, the ground and power regions of all layers are stacked directly on top of each other. The alignment of ground and power layers directly over each other improves signal integrity for data signals routed through the multilayer packaging substrate. For example, signal traces for ground-referenced signals can be located not only between ground conductors in the layers where the signal traces occur. The area of an adjacent layer, above and/or below, can also include ground conductors and omit power conductors to avoid electromagnetic coupling with power conductors.

In addition to improved signal integrity, the disclosed signal routing and interconnection method presents several notable advantages to traditional techniques. The ability to route signals between ICs without limiting power connections can improve routing flexibility and reduce the area required to mount and connect multiple die. Depopulating regions and patterning traces only at regular intervals enables data signals to be routed underneath a die while still providing power and ground connections to the IC through the adjacent remaining ball and via contacts. Routing data signal traces on multiple layers of the packaging substrate yields possibilities for denser and more complex data signal routing schemes. The ratio of data signal traces to power/ground connections can differ in different regions of the semiconductor die to account for differing demands of different regions of the IC. For example, data signal traces can be routed under some portions of the IC, but not under other portions of the IC.

In some implementations, the IC may be custom designed to mate with a particular signal routing scheme on multilayer packaging substrate. For example, the IC can be designed to omit contacts over the areas where signal traces are present in layer L1. Similarly, the IC can be designed to omit input and output contacts corresponding to the region represented in FIG. 3. Alternatively, the signal routing scheme on the multilayer packaging substrate may be custom designed to mate with a particular IC or the IC and multilayer packaging substrate may be designed in tandem to achieve a desired signal routing solution.

Figure 4:
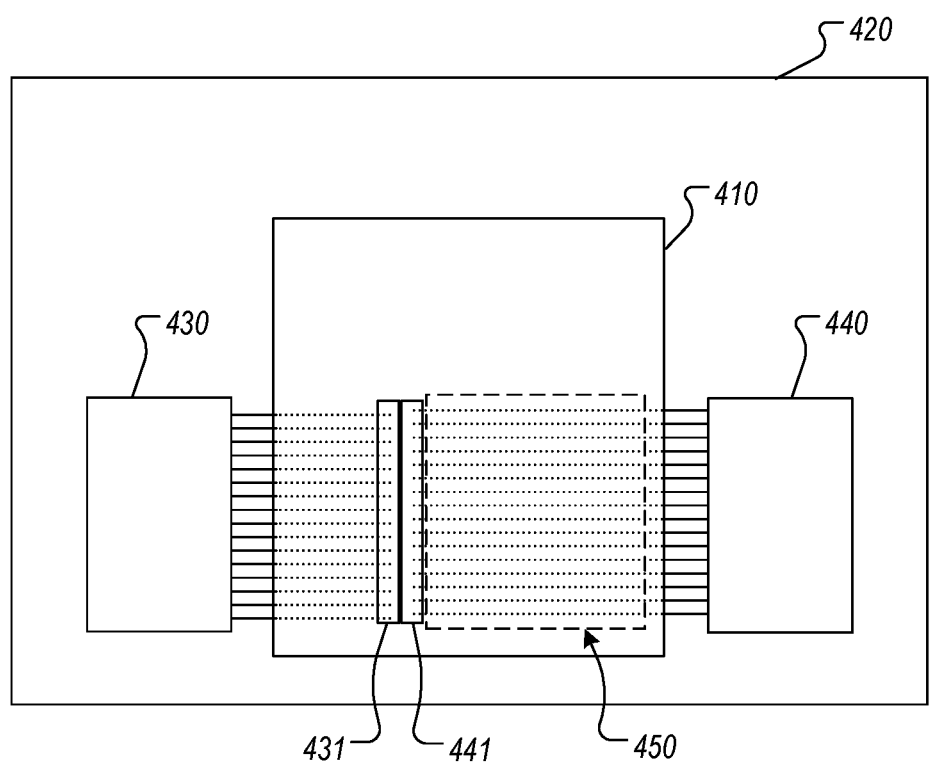
FIG. 4 is a diagram that illustrates a top view of an example of a substrate with integrated circuits attached.

FIG. 4 is a diagram that illustrates an example system 400 that uses signal routing and interconnection in semiconductor packaging. In system 400, a multilayer packaging substrate electrically interconnects an IC to one or more memory devices.

The system 400 includes a substrate 420. The substrate 420 may be a printed circuit board (PCB), a chip-scale package, a flip-chip BGA substrate, or another packaging substrate. The substrate 420 may comprise a redistribution layer (RDL). In some cases, the substrate 420 may include no more than four layers, e.g., no more than four layers with conductive traces or other conductive metal regions. The substrate 420 may be configured to receive the IC 410 or other semiconductor die.

An IC 410 is attached to the top of substrate 420. The IC may be, for example, a CPU, a GPU, an APU, an ASIC or another circuit. The IC 410 may be a semiconductor die. The substrate 420 has a particular region 450 located below the IC 410. The region 450 may be located in an area of the substrate 420 that is configured to mate with the IC 410 and provide power and ground connections to the IC 410.

Two memory devices 430 and 440 are attached to the top of the substrate 420. The memory devices 430 and 440 may be, for example, dynamic random access memory (DRAM), static random access memory (SRAM) double data-rate memory (DDR), low power data rate memory (LPDDR) or any other memory device, technology, or module. The memory devices 430 and 440 may be the same technology (i.e. both LPDDR) or they may be different technologies.

The substrate 420 has on the top layer, one memory region configured to mate with memory device 430 and a second memory region configured to mate with memory device 440, where the memory regions are located on different sides of the region 450. Additionally, the IC 410 includes one set of contacts 431 for coupling with memory device 430 and a second set of contacts 441 for coupling with memory device 440, where both sets of contacts are located on one side (the left) of region 450. In order to connect the second set of contacts 441 to the memory device 440, signal traces must traverse the region 450.

Within the region 450, the top layer of the multilayer substrate 420 has power and ground contacts for coupling to the terminals of the IC 410. The contacts may be, for example, metal ball contacts, bumps, pads, or other conductive connections. The contacts may be in the form of a ball grid array (BGA). In some cases, the substrate 420 may not include any input or output contacts in the region 450.

Also within the region 450, the bottom layer of the multilayer substrate 420 has power and ground contacts for coupling to another device. The other device could be, for example a main circuit board, a motherboard, an integrated circuit, a printed circuit, or another device. The power and ground contacts on the bottom layer of the multilayer substrate 420 may be solder balls, bump connections, pads, or other electrical contacts. The contacts on the bottom layer may be ball grid array (BGA) solder balls.

Within the region 450, the layers of the multilayer substrate 430 may have a repeating pattern of regions corresponding power and ground connections. The regions may be metallized regions that are conductive along the entire region. The regions may be a series of discrete conductive elements (e.g., bumps or other contacts, vias, etc.). For example, a region corresponding to power may be a row of contacts that each connect to power, a row of vias that each connect to power, a metal region providing a power plane in a layer, and so on. Accordingly, the region for power or ground need not be continuously conductive over the region. Nevertheless, a power region of a layer may be arranged so that it does not include any ground connections (e.g., vias or contacts for power in the region are not interrupted by or interspersed with ground conductors). Similarly, a ground region of a layer may be arranged so that it does not include any power connections. In some implementations, both the power regions and the ground regions do not include input/output connections of the semiconductor die above or below the regions.

In some implementations, the repeating patterns of regions for power and ground may be arranged so that ground regions are located directly over each other and power regions are located directly over each other.

Within the region 450, at least one layer of the multiple layers has a repeating pattern of signal traces that extend across the region 450 in order to electrically connect contacts 441 to memory device 440. Here, the signal traces extend along and are located between the conductive ground regions of the layer. In some implementations, the top layer of the substrate 420 includes signal traces arranged in a repeating pattern that extend along and are located between ground contacts used to couple to the IC 410. In some cases, the signal traces in the top layer of the multilayer packaging substrate 450 may be arranged in multiple groups of signal traces that each include multiple signal traces. Here, each group of signal traces may extend from one side of the region 450 to the opposite side of region 450. For ground-referenced signals, each group of signal traces may be closer to the ground contacts of the top layer than the power contacts of the top layer along the entire extent of the signal traces across region 450.

In some implementations, the contacts on the top layer of the substrate 420 may be arranged in a grid that includes a repeating pattern of rows of contacts for power and ground connections to the IC 410. Here, the grid may include multiple depopulated rows that do not include contacts, where the signal traces are patterned to extend along the depopulated rows.

In some implementations, there may be an intermediate layer directly below the top layer of the substrate 420. The intermediate layer may include metal ground regions coupled to the ground contacts of the top layer, where the metal ground regions of the intermediate layer are located directly beneath and extend along the length of the signal traces of the top layer. Furthermore, the intermediate layer may include alternating metal regions that are respectively coupled to ground contacts and power contacts of the top layer.

In some systems, two or more layers of the substrate 420 may include signal traces across the region 450. For example, in a four-layer substrate 420, the first (top) layer and the third layer may each include signal traces extending across the region 450 while the second layer and fourth (bottom) layer may not include signal traces. The signal traces in a given layer of the substrate 420 may be placed over the ground contacts of the bottom layer and may be aligned to extend along the ground contacts of the bottom layer.

In some implementations, where two or more layers of the substrate 420 contain signal traces, the signal traces on the layers may be arranged so that the signal traces of one layer are placed over the signal traces of another layer. Here, there may be an intermediate layer between the two signal trace containing layers. The intermediate layer may contain a ground-connected region such that the ground region is located between the signal traces of the two or more signal trace containing layers.

In some implementations, the repeating patterns of conductive regions for power and ground in the region 450 may extend substantially linearly across the region 450. The signal traces can also extend substantially linearly across the region 450. In some cases, the alternating metal regions on any of the layers of the substrate 420 may be ground stripes and power stripes. In these cases, for those layers that contain signal traces, the signal traces may be located in the ground stripes. The ground stripes may be aligned in each of the layers of the substrate 420 and the power stripes may be aligned in each of the layers of the substrate 420.

Although the examples of FIGS. 2 and 3 show a substrate that includes four layers, a substrate may include more or fewer layers. For example, in some implementations, if sufficient signal traces are provided in layer L1, then layer L3 may be omitted. As another example, if additional signal traces are desired, additional layers similar to layers L2 and L3 may be inserted between layers L3 and L4, e.g., a set of layers L1, L2, L3, L2, L3, L4. Other arrangements and patterns can also be used.

Thus, particular embodiments of the invention have been described. Other embodiments are within the scope of the following claims. For example, different sub-combinations of features in the claims may be used to achieve desirable results.

The invention claimed is:

1. A substrate configured to couple with an integrated circuit, the substrate comprising a first layer comprising a region comprising one or more signal traces that span the region, wherein the first layer comprises power stripes and ground stripes, wherein the signal traces that span the region are arranged in between the ground stripes such that at least one row of ground conductive elements of the ground stripes separates the power stripes from the signal traces.

2. The substrate of claim 1, wherein the one or more signal traces comprise multiple signal traces that extend parallel to each other across the region.

3. The substrate of claim 1, wherein the ground conductive elements comprise conductive vias that form ground connections with an adjacent layer of the substrate.

4. The substrate of claim 1, further comprising a second layer having a series of contacts configured to couple with ground contacts of a circuit board.

5. The substrate of claim 1, further comprising a second layer having power stripes that are aligned with the power stripes of the first layer.

6. The substrate of claim 1, further comprising a second layer adjacent to the first layer, wherein the second layer comprises stripes of ground conductive elements that are aligned with the signal traces that span the region of the first layer.

7. The substrate of claim 6, wherein the one or more signal traces arranged in between the ground stripes are isolated from power stripes by ground conductive elements of an adjacent substrate layer.

8. The substrate of claim 1, wherein the first layer is a layer of the substrate configured to receive an integrated circuit, and wherein the ground stripes comprise ground conductive elements configured to couple with the integrated circuit.

9. The substrate of claim 8, wherein the contacts are conductive bumps configured to mate with solder balls of a ball grid array package.

10. A substrate configured to couple with an integrated circuit, the substrate having multiple layers comprising a first layer and a second layer, wherein the first layer and the second layer each comprise a repeating pattern of power subregions and ground subregions in a particular region of the substrate, wherein the repeating patterns in the first layer and the second layer are aligned so that (i) power subregions in the first and second layers are stacked vertically and (ii) ground subregions corresponding to ground in the first and second layers are stacked vertically.

11. The substrate of claim 10, wherein the substrate has one or more signal traces that span the particular region, and wherein a ground subregion in the second layer is aligned with the one or more signal traces.

12. The substrate of claim 11, wherein the one or more signal traces are isolated from power subregions by ground conductive elements of an adjacent substrate layer.

13. A substrate configured to couple with an integrated circuit, the substrate having power stripes for power transmission and ground stripes for ground conductivity, wherein one or more signal traces are arranged within one of the ground stripes providing ground conductivity such that at least one row of ground conductive elements of the ground stripes separates the power stripes from the signal traces.

14. The substrate of claim 13, wherein the substrate has multiple layers include a first layer having the signal traces arranged within the ground stripes and a second layer having ground stripes aligned with ground stripes of the first layer.

15. The substrate of claim 14, wherein the one or more signal traces are isolated from power stripes by ground conductive elements of an adjacent substrate layer.

* * * * *